May 3, 1960 M. L. SELKER 2,935,386

METHOD OF PRODUCING SMALL SEMICONDUCTOR SILICON CRYSTALS

Filed Jan. 3, 1956 2 Sheets-Sheet 1

INVENTOR.
MILTON L. SELKER
BY
William J. Flynn
ATTORNEY

May 3, 1960 M. L. SELKER 2,935,386

METHOD OF PRODUCING SMALL SEMICONDUCTOR SILICON CRYSTALS

Filed Jan. 3, 1956 2 Sheets-Sheet 2

INVENTOR.
MILTON L. SELKER

BY *William J. Flynn*
ATTORNEY

United States Patent Office 2,935,386

Patented May 3, 1960

2,935,386

METHOD OF PRODUCING SMALL SEMICONDUCTOR SILICON CRYSTALS

Milton L. Selker, Shaker Heights, Ohio, assignor to Clevite Corporation, Cleveland, Ohio, a corporation of Ohio Application January 3, 1956, Serial No. 556,998

6 Claims. (Cl. 23—301)

This invention relates to small semiconductive silicon crystals suitable for use in semiconductor devices, to semiconductor diodes and transistors made from such crystals, and to a method of producing such crystals.

In recent years the semiconductive materials germanium and silicon have been the subject of extensive activity directed toward the production of various semiconductor devices, such as diodes and transistors. In some respects silicon is superior to germanium for use in such semiconductors. For example, silicon has better rectifying properties and has stable electrical characteristics over a wider temperature range, including temperatures at which germanium is no longer suitable as a semiconductor. Also, silicon semiconductor devices are adaptable to higher power operation. In addition, silicon has a lower sensitivity to surface treatment during the fabrication of semiconductor devices therefrom. In spite of these advantages, silicon has not come into as extensive use in semiconductor devices as germanium. Primarily this is because of serious practical difficulties in processing silicon into crystal elements suitable for use in semiconductor devices.

One important aspect of the present invention is directed to a novel method of producing silicon crystal elements suitable for use in semiconductor devices which avoids certain of the difficulties present in previous processes.

Accordingly, it is an object of the present invention to provide a novel and improved method of producing small sized silicon crystal elements for semiconductor devices.

A still further object of this invention is to provide a novel method of producing small silicon crystal elements for use in semiconductor devices which reduces the expense and the number of steps required for producing such crystal elements.

Another object of this invention is to provide a novel method of producing silicon suitable for use in semiconductor devices which avoids contamination of the silicon while in its molten condition.

A further object of this invention is to provide a novel silicon crystal globule of appropriate size and electrical characteristics for use as the crystal element in a semiconductor device.

A further object of this invention is to provide a novel semiconductor diode incorporating such a silicon crystal globule.

Likewise, it is an object of this invention to provide a novel transistor which incorporates such a silicon crystal globule.

Other and further objects and advantages of the present invention will be apparent from the following description of presently preferred embodiments thereof, which are described in detail with reference to the accompanying drawings.

Figures 1, 2:
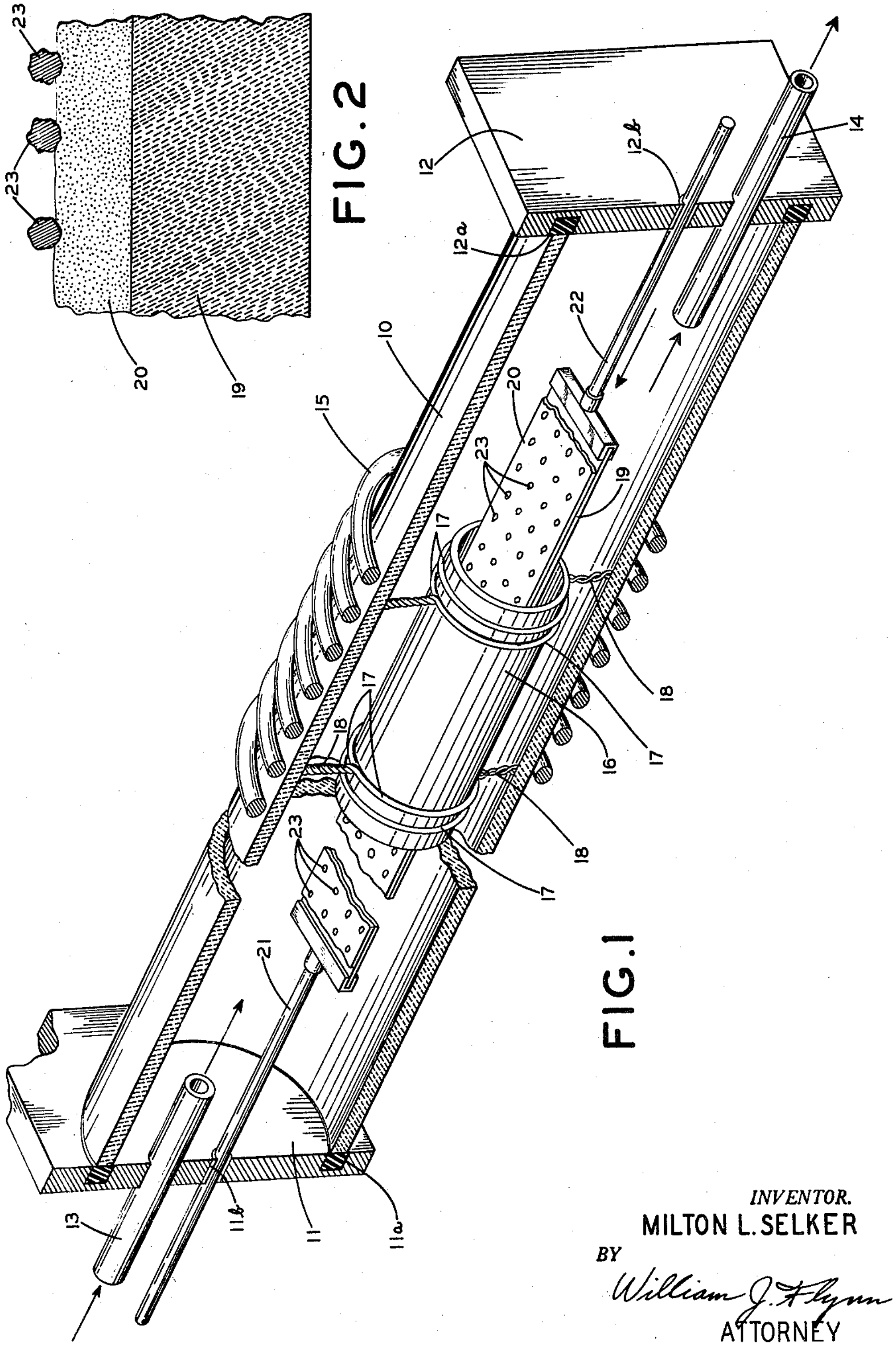
Figure 1 is a perspective view, with parts broken away, showing apparatus for producing silicon crystal elements in accordance with the present invention.
Figure 2 is a fragmentary cross section through the silicon specimens and the support therefor in the Fig. 1 apparatus.

Referring to Fig. 1, there is provided a furnace for melting small specimens of silicon which includes an elongated quartz tube 10, which in one practical embodiment may be about two inches in diameter. One end of the quartz tube 10 is closed by a metal end cap 11 carrying a silicone rubber gasket 11a which engages the end of tube 10 in gas-tight fashion. The opposite end of tube 10 is closed by a similar end cap 12 carrying a silicone rubber gasket 12a engaging that end of tube 10 in gas-tight fashion. A suitable clamping arrangement may be provided to clamp the end caps tightly against the ends of tube 10 in this manner. The end cap 11 receives a conduit 13 for passing a suitable nonreactive gas, such as argon, into the interior of the quartz tube 10. A gas outlet conduit 14 extends through the other end cap 12.

An induction heating coil 15, which may be connected to any suitable energization source (not shown), extends closely around the quartz tube 10 for a length of about two inches midway along the tube. Within the quartz tube 10 there is positioned a high frequency susceptor in the form of a tubular cylinder 16 which preferably extends coaxial with the tube and which, in the case of a two inch diameter quartz tube, may have a diameter of about 1 inch. The cylinder 16 is of tantalum, molybdenum, tungsten, pure graphite or rhenium.

A plurality of wires 17 are wrapped around the cylinder 16 and then twisted together at their ends to provide legs 18 which at their outer ends have substantially point contacts with the inner wall of the quartz tube 10. Tungsten wires would be used for this purpose if the cylinder is made of any of the metals named above.

Alternatively, the cylinder 16 might be of graphite, in which case it may be provided with thin integral graphite legs in place of the tungsten wires. In such event, however, these graphite legs should not be permitted to contact the quartz tube directly. Small pieces of pure alumina or beryllia should be interposed between these graphite legs and the quartz tube.

With either of these arrangements, the susceptor contacts the quartz tube through small cross-section supports of a very refractory material, thereby avoiding destruction of the quartz by excessive heat or through reaction of hot quartz with the vapors present in the tube or with the susceptor material. These small cross-section supports serve to locate and support the susceptor cylinder 16 properly within the quartz tube 10. With this arrangement the susceptor cylinder 16 is positioned to be induction heated by coil 15 and to provide a heating zone about two inches long within the quartz tube.

The refractory support for the silicon to be melted and subsequently cooled is in the form of a slab or boat 19 of pure fused alumina, alumina-mullite, silicon carbide or graphite, provided with a layer 20 of crystalline quartz powder. In one practical embodiment this powder is made by crushing selected fusing grade natural Brazilian crystal quartz ("lascos") in a tool steel mortar, leaching with aqua regia, washing and drying, and sieving through silk bolting cloth. Preferably, the powder particles are of a size such that they are retained by a sieve having .002 inch openings and passed by a sieve having .004 inch openings.

The refractory slab 19 is connected at its opposite ends to stainless steel rods 21 and 22, respectively, which extend through nylon bushings 11*b* and 12*b* in the end caps 11 and 12 in substantially gas-tight relationship. These rods are connected to a suitable source of motive power (not shown) which imparts to them a longitudinal motion to the left in Fig. 1. With this arrangement, the refractory support 19, 20 moves lengthwise through the susceptor cylinder 16 at a suitable constant linear speed. A plurality of small speciments 23 of silicon are supported on the refractory slab in contact with the crystal quartz powder particles 20. These silicon specimens preferably each have a mass substantially equal to the desired mass of the crystal for the semiconductor device. In the embodiment now under discussion the specimen mass is equivalent to that of a silicon sphere .045 inch in diameter. This particular particle size is not critical since the specimen may be smaller or larger, depending upon the requirements of the semiconductor device for which it is intended to be used as the crystal element. However, the specimen mass should not exceed that of a silicon sphere .150 inch in diameter.

These silicon specimens may be prepared by reacting silicon tetrachloride with zinc vapor in a quartz container, which produces polycrystalline silicon needle crystals having traces of zinc. Needle crystals of proper size can be used directly as the silicon specimens in the present process. Oversized needle crystals can be powdered and pressed into suitable particle size and thereafter sintered to provide the somewhat irregularly shaped small specimens shown in Fig. 2.

With these specimens of silicon supported on the refractory support 19, 20, the refractory support is moved through the heating zone provided by the susceptor cylinder 16 at a speed of ⅛ inch per minute. The susceptor cylinder is heated to a temperature of about 1660° C. so as to establish in the heating zone at which the silicon specimens are located a temperature of about 1460° C. A continuous stream of purified argon is passed through tube 10 from the inlet conduit 13 to the outlet conduit 14 and establishes a pressure equal to about 40 to 60 millimeters of mercury in the tube. The silicon specimens reach molten condition just before emerging from the heating zone within the susceptor cylinder 16 and upon emerging from the cylinder 16 they cool into approximately tear drop shaped globules.

After cooling, the silicon globules 23*a* are removed from the furnace. A small amount of quartz sand may adhere to the bottoms of the globules. This may be removed by immersion in hot hydrofluoric acid. In order to clean the surfaces of the globules or to reduce their size they may be etched in an aqueous mixture of acetic acid, hydrofluoric acid, nitric acid and bromine. Also, if desired, the silicon globules can be ground to spherical shape by tumbling in a ball mill containing liquid honing material. If other than a spherical globule shape is desired the globules may be subjected to appropriate preferential etches.

In the foregoing process synthetic quartz crystal powder can be used as the supporting material for the silicon globules, but it is slightly inferior to natural quartz in its refractory properties.

The specific nature of the material which contacts the silicon speciments during melting and subsequent cooling has been found to be quite critical. It must be pure enough that it does not contaminate the silicon appreciably. It must have good refractory properties. It must not be readily wet by the molten silicon. In the case of massive solid supports made of quartz, silicon carbide, diamond and crystalline alumina, respectively, it was found that the molten silicon wets and adheres to the support. On a support of powdered fused silica, the silicon spread and formed flat-bottomed irregular shapes, and a large portion of the free surface of the silicon was covered with the fused quartz powder. When a powder of silicon carbide, diamond or crystalline alumina is used, it was impossible to produce silicon globules uncontaminated by the support powder. In the case of silicon carbide powder and diamond powder, either reaction of the silicon with the support powder or complete wetting and spreading out took place. With alumina powder it was possible to produce balls of silicon, but these were completely encrusted with alumina particles which showed evidence of considerable reaction with the silicon.

Even less satisfactory results are obtained with solid or powder supports of other refractories.

Only in the case of a supporting powder of unfused crystal quartz did the molten silicon pull up into a ball which was substantially uncontaminated by the support powder. The molten silicon ball solidified into a teardrop shape, with the unfused quartz powder adhering only to a portion of the bottom of the solidified teardrop.

The teardrop shaped silicon globules obtained by this process are polycrystalline, consisting usually of a few large grains. The grain boundaries are nearly always planar, so that probably they are twins. Twin boundaries do not seriously affect diode or lifetime characteristics in semiconductor devices.

In order to facilitate soldering the silicon globules to base electrodes they are first nickel plated by the Brenner "electroless" process according to the reactions $$NiCl_2 + NaH_2PO_2 + H_2O \rightarrow Ni + HCl + N_2H_2PO_3$$

$$N_2H_2PO_2 + H_2O \rightarrow H_2 + N_2H_2PO_3$$

Figure 3:
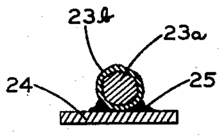
Figure 3 is a section through a silicon globule made in the Fig. 1 furnace and subsequently nickel plated and soldered to a brass base.

This is carried out in a polyethylene bottle on a ball mill so that the silicon globules are uniformly nickel plated all over their surfaces. Each silicon globule 23*a* plated with a nickel layer 23*b* is then soldered to a brass disc or plate 24 using 50–50 lead-tin solder 25, leaving the article shown in cross section in Fig. 3.

Figure 4:
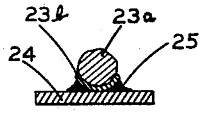
Figure 4 is a view similar to Fig. 3 and showing the silicon globule and base unit after the removal of the exposed nickel plating on the globule.

The resulting articles may then be tumbled in a liquid honing solution which contains an abrasive dispersion to remove the nickel from the exposed surfaces of the silicon globule, leaving the article shown in Fig. 4.

Alternatively, the nickel on the exposed surfaces of the globule can be removed by means of selective chemical etches.

Figure 5:
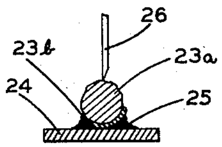
Figure 5 is a section through a diode made from the Fig. 4 unit.

With the brass base 24 having been applied in the manner described and the excess nickel removed by either of the foregoing procedures, a thin "cat whisker" wire 26 (Fig. 5) may be positioned in rectifying point contact with the silicon globule 23*a* anywhere on the unplated surfaec of the globule, preferably directly opposite the brass plate 24. If desired, in order to enhance mechanical stability the wire 26 may be bonded to the globule by appropriately pulsing the diode. In the case of N-type silicon the wire electrode 26 serves as the anode of the diode and the brass plate 24 through its solder connection makes low resistance electrical contact with the silicon globule and serves as the base electrode.

While the silicon globules made by the foregoing process are polycrystalline they have sufficiently good rectifying properties that diodes made from them are adequate for many circuit applications. In a typical embodiment the diode has a forward current of several milliamperes at one volt, a reverse current of about .001 milliampere at one volt, and a peak inverse voltage at .5 milliampere of about 20 volts.

Figure 6:
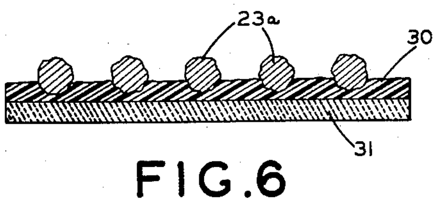
Figure 6 is a section showing several silicon globules partially embedded in shellac on a ceramic plate prior to being nickel plated to facilitate soldering to a base electrode.

As an alternative to completely nickel plating the silicon globules, before plating the globules 23*a* may be placed in molten shellac 30 on a ceramic plate 31, as shown in Fig. 6, and then the whole assembly is immersed in the plating solution. The shellac masks part of the surface of each silicon globule 23*a* and only the remainder of the globule is nickel plated. The plated portion of each globule is then soldered to a base electrode, as described above, and the wire electrode contact is made to the unplated portion of the globule.

Figure 7:
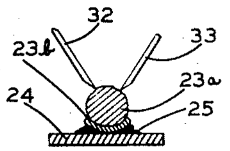
Figure 7 is a section through a point contact transistor made from the Fig. 4 unit.

A point contact transistor can be fabricated from the unit composed of silicon globule 23*a* and the attached base 24 by simply providing two "cat whisker" wire electrodes 32, 33 making spaced point contacts on the unplated surface of the silicon globule 23*a*, as shown in Fig. 7.

The silicon globule in accordance with the present invention is very well adapted for the simplified production of an alloy junction, or fused junction, diode. For example, in the case of a globule of N-type silicon, a piece of tin is place in contact with one side of the globule and a piece of aluminum-tin alloy is placed in contact with the opposite side of the globule. When this assembly is heated to 900° C. under hydrogen, the tin bonds to the silicon globule and makes a low resistance contact to the globule which may be soldered to a brass base electrode later. The aluminum in the aluminum-tin alloy penetrates into the silicon and produces a semiconductive silicon-aluminum region of P-type conductivity separated from the N-type silicon by a rectifying junction barrier. An electrode wire can be soldered to the aluminum-tin contact later on.

In several practical embodiments of the fused or alloy junction diode made this way, the following diode characteristics were noted:

| | | |
|---|---|---|
| Forward current at 1 volt | milliamperes | 14 to 70 |
| Reverse current at 1 volt | do | .001 to .028 |
| Peak inverse voltage at 5 ma. | volts | 7.5 to 32 |

In some instances improvement in the reverse current characteristic was noted after a superoxyl etch of the diodes.

Figure 8:
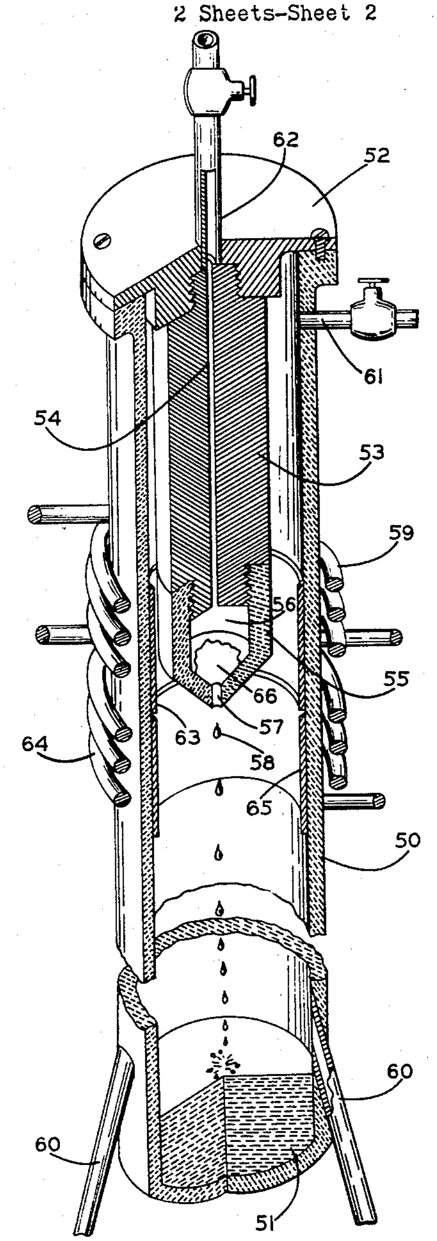
Figure 8 is a perspective view, with parts broken away, showing a "shot tower" apparatus for producing silicon globules in accordance with the present invention.

In a further process embodying the present invention, referring to Fig. 8, there is provided a shot tower arrangement for producing crystal silicon globules of a size appropriate for use as the crystal elements in semiconductor diodes or transistors. Referring to this figure, there is provided a depending quartz tube 50 closed at its lower end and containing there a suitable liquid bath 51 for receiving the globules. Suspended from the top cover 52 for the tube is a hollow rod 53 having a vertical passage 54. An inlet pipe 62 is provided for passing gas down into passage 54. A quartz crucible 55 is threadedly secured to the lower end of rod 53 and is formed with a melting chamber 56 communicating with the lower end of passage 54. At its lower end the crucible is formed with a restricted vertical bore 57 for passing by gravity molten drops of silicon 58 one at a time as the silicon is melted in the chamber 56. An induction heating coil 59 surrounds a cylindrical graphite susceptor 63 located within the quartz tube 50 at the level of the melt chamber 56. An induction heating coil 64 surrounds a cylindrical graphite susceptor 65 within tube 50 which extends down a predetermined distance below the lower end of bore 57.

For providing a purified atmosphere in the furnace and for delaying the descent of the molten silicon drops so that they fall at a preselected speed, there are provided a plurality of upwardly directed gas inlets 60 which pass argon upward into the tube 50. The argon leaves through a discharge outlet 61.

In operation, when the heater coil 59 is energized it heats the silicon mass 66 in melting chamber 56 so that the silicon melts, the molten drops flowing one by one down through the bore 57 as argon flows from the upper inlet 62 down through rod passage 54, melting chamber 56 and bore 57. In the initial part of their free fall, the molten silicon drops are within the heating zone provided by coil 64 and susceptor 65, so that the molten condition of the drops is prolonged.

The upward flow of argon from the inlet 60 delays the fall of the drops and assists in providing the desired temperature gradient so that the molten silicon drops cool at such a rate that they solidify in the desired manner, preferably as single crystals. Obviously, the rate of flow of the upwardly directed argon, the size of bore 57, the length of the melting zone provided by susceptor 65, the temperature to which the silicon is heated, and the distance of the free fall of the molten silicon drops all must be correlated to promote the desired crystal growth. In some instances, it may be preferable to eliminate the upward flow of argon or to so modify it that it does not substantially oppose the free fall of the silicon drops, for example, if the tube 50 is long enough that the silicon drops solidify in the desired manner before entering the liquid 51.

The crystal silicon globules produced by this technique may then be processed as described above to produce therefrom point contact diodes, bonded diodes, point contact transistors, or alloy junction diodes.

While there have been disclosed herein certain preferred embodiments of the present invention, it is to be understood that various modifications, omissions and refinements which depart from the disclosed embodiments may be adopted without departing from the spirit and scope of the present invention. Also, it is to be understood that the term "silicon," as used in the foregoing description and the appended claims, admits of the presence of donor or acceptor impurities in small amounts which impart the desired electrical characteristics to the silicon, as is well understood in the semiconductor art.

I claim:

1. A method of producing semiconductive silicon which comprises the steps of: supporting silicon in contact with crystalline quartz powder, and heating to molten condition and thereafter cooling the silicon in a non-reactive atmosphere while thus supported in contact with the crystalline quartz powder.

2. A method of producing a semiconductive silicon crystal element which comprises the steps of: supporting in contact with crystalline quartz powder a silicon specimen having a mass substantially equal to the desired mass of the finished crystal element, and heating to molten condition and thereafter cooling the silicon specimen in a non-reactive atmosphere while thus supported in contact with the crystalline quartz powder.

3. A method of producing a semiconductive silicon crystal for use as the crystal element in a diode or transistor which comprises the steps of: supporting in contact with crystalline quartz powder a silicon specimen having a mass equivalent to that of a silicon sphere not larger than .150 inch in diameter, positioning said silicon specimen supported in contact with the crystalline quartz powder in the melting zone of a furnace having a non-reactive atmosphere and establishing an elevated temperature in said melting zone to melt the silicon specimen, and subsequently cooling the silicon specimen in a non-reactive atmosphere while supported in contact with the crystalline quartz powder.

4. A method of producing a semiconductive silicon crystal element which comprises supporting in a non-reactive atmosphere a silicon specimen having a mass equivalent to that of a silicon sphere not larger than .150 inch in diameter in contact with crystalline quartz powder while melting the silicon specimen and subsequently permitting it to solidify.

5. A method of producing a semiconductive silicon crystal globule for use as the crystal element in a semiconductor diode or transistor which comprises the steps of: supporting a silicon specimen on a refractory support which presents crystalline quartz powder in contact with the silicon specimen, said specimen having a mass equivalent to that of a silicon sphere .150 inch in diameter or smaller, moving said support with the silicon specimen thereon through and beyond a melting zone, maintaining in said melting zone a temperature sufficient to melt the silicon specimen just before leaving the melting zone, maintaining beyond said melting zone a lower temperature which permits the melted silicon specimen to solidify into a globule supported in contact with said crystalline quartz powder, and maintaining a non-reactive atmosphere around said support and the silicon specimen at and beyond said melting zone during the melting and subsequent solidification of the silicon specimen.

6. The method of claim 5, wherein said crystalline quartz powder is composed of particles capable of passing .004 inch sieve openings and being retained by .002 inch sieve openings, and said non-reactive atmosphere is argon.

References Cited in the file of this patent

UNITED STATES PATENTS

| | | |
|---|---|---|
| 2,537,257 | Brattain | Jan. 9, 1951 |
| 2,668,262 | Dunlap | Feb. 2, 1954 |
| 2,686,212 | Horn et al. | Aug. 10, 1954 |
| 2,708,255 | White | May 10, 1955 |
| 2,712,621 | North | July 5, 1955 |
| 2,723,370 | Bradshaw | Nov. 8, 1955 |
| 2,728,881 | Jacobi | Dec. 27, 1955 |
| 2,789,039 | Jensen | Apr. 16, 1957 |
| 2,823,102 | Selker et al. | Feb. 11, 1958 |

OTHER REFERENCES

"Review of Scientific Instruments," vol. 25, No. 3, March 1954, pages 298–299.

Schumaker: "Journal of Metals," November 1953, pages 1428–1429, Fig. 1.